(12) United States Patent
Sjong

(10) Patent No.: US 9,859,034 B2
(45) Date of Patent: Jan. 2, 2018

(54) FUNCTIONALIZED BORON NITRIDE MATERIALS AND METHODS FOR THEIR PREPARATION AND USE

(71) Applicant: EMPIRE TECHNOLOGY DEVELOPMENT LLC, Wilmington, DE (US)

(72) Inventor: Angele Sjong, Louisville, CO (US)

(73) Assignee: Empire Technology Development LLC, Wilmington, DE (US)

( * ) Notice: Subject to any disclaimer, the term of this patent is extended or adjusted under 35 U.S.C. 154(b) by 147 days.

(21) Appl. No.: 14/665,472

(22) Filed: Mar. 23, 2015

(65) Prior Publication Data

US 2016/0280980 A1    Sep. 29, 2016

(51) Int. Cl.
| | | |
|---|---|---|
| *H01B 1/14* | (2006.01) | |
| *H01B 1/18* | (2006.01) | |
| *C09K 5/14* | (2006.01) | |
| *H01L 23/14* | (2006.01) | |
| *H01L 23/498* | (2006.01) | |

(Continued)

(52) U.S. Cl.
CPC ............. *H01B 1/14* (2013.01); *C04B 14/327* (2013.01); *C04B 35/583* (2013.01); *C09K 5/14* (2013.01); *H01B 1/18* (2013.01); *H01L 23/145* (2013.01); *H01L 23/147* (2013.01); *H01L 23/49877* (2013.01); *H01L 23/53271* (2013.01);

(Continued)

(58) Field of Classification Search
CPC ... H01B 1/00; H01B 1/02; H01B 1/04; H01B 1/14; H01B 1/16; H01B 1/18; C05K 5/14; H05K 1/0277; H05K 1/028; H05K 1/0281; H01L 23/14; H01L 23/145; H01L 23/147; H01L 23/15; H01L 23/49877; H01L 23/53204; H01L 23/53209; H01L 23/53271; H01L 23/53276; H01L 23/53285; H01L 21/76877; H01L 21/76879; H01L 21/76883; C04B 14/327; C04B 35/583; C04B 35/5831; C04B 41/4501; C04B 41/4515; C04B 41/4523; C04B 41/4529; C04B 41/4531; C04B 41/4533; C04B 41/5064; C01B 35/00; C01B 35/14; C01B 35/146; C01B 31/064; C01B 31/0648

See application file for complete search history.

(56) References Cited

U.S. PATENT DOCUMENTS

| | | | | |
|---|---|---|---|---|
| 8,790,775 B2* | 7/2014 | Kim | ....................... | H01L 29/778 428/336 |
| 2014/0131626 A1* | 5/2014 | Lee | ........................ | B82Y 30/00 252/500 |

(Continued)

OTHER PUBLICATIONS

Ci et al. ("Atomic layers of hybridized boron nitride and graphene domains," Nature Materials, vol. 9, pp. 430-435, 2010).*

(Continued)

*Primary Examiner* — Mark Kopec
*Assistant Examiner* — Matthew R Diaz
(74) *Attorney, Agent, or Firm* — Pepper Hamilton LLP

(57) ABSTRACT

A polymeric flexible substrate may be formed from h-BN sheets having a monolayer of hexagonal born nitride interspersed with domains of at least one functionalized material. The functionalized h-BN sheets may be used in various electronic components such as in circuit boards and touch sensors.

19 Claims, 9 Drawing Sheets

(51) Int. Cl.
- H01L 23/532 (2006.01)
- H05K 1/02 (2006.01)
- C04B 14/32 (2006.01)
- C04B 35/583 (2006.01)
- H01L 21/768 (2006.01)

(52) U.S. Cl.
CPC ....... *H01L 23/53276* (2013.01); *H05K 1/028* (2013.01); *H01L 21/76879* (2013.01)

(56) References Cited

U.S. PATENT DOCUMENTS

| | | | | |
|---|---|---|---|---|
| 2014/0299839 A1* | 10/2014 | Shepard | ............. | H01L 29/1606 257/29 |
| 2014/0319467 A1* | 10/2014 | Iannaccone | ........... | H01L 29/778 257/27 |
| 2015/0044367 A1* | 2/2015 | Sutter | ................... | C23C 16/342 427/249.5 |

OTHER PUBLICATIONS

Sutter et al. ("Interface formation in monolayer graphene-boron nitride heterostructures," Nano. Lett., 12, 4869-4874, 2012).*

Al-Kandary et al., Morphology and thermo-mechanical properties of compatibilized polyimide-silica nanocomposites, *Journal of Applied Polymer Science* (Dec. 15, 2005), 98(6):2521-2531.

Lin et al., Defect Functionalization of Hexagonal Boron Nitride Nanosheets, *Journal of Physical Chemistry C* (Sep. 21, 2010), 114(41):17434-17439.

Georgakilas et al., Functionalization of Graphene: Covalent and Non-Covalent Approaches, Derivatives and Applications, *Chemical Reviews* (Sep. 25, 2012), 112(11):6156-6214.

Lee et al., Frictional characteristics of atomically thin sheets, *Science* (Apr. 2, 2010), 328(5974):76-80.

Lee et al., Large-scale synthesis of high-quality hexagonal boron nitride nanosheets for large-area graphene electronics, *NanoLetters* (Jan. 5, 2012), 12(2):714-718.

Liu et al., Heteroepitaxial growth of two-dimensional hexagonal boron nitride templated by graphene edges, *Science* (Jan. 10, 2014), 343(6167):163-167.

Liu et al., In-plane heterostructures of graphene and hexagonal boron nitride with controlled domain sizes, *Nature Nanotechonology* (Jan. 27, 2013), 8:119-124.

Research group is studying the synthesis of a new promising nanomaterial, retrieved from URL:https://web.archive.org/web/20090703164154/http://www.csc.fi/english/csc/news/news/boron_nitride_nanotubes_pr, on Dec. 3, 2014, posted on Jun. 16, 2009, pp.1-2.

Sainsbury et al., Covalently functionalized hexagonal boron nitride nanosheets by nitrene addition, *Issue Chemistry—A European Journal* (Aug. 27, 2012), 18(35):10808-10812.

Xue et al., Functionalization of Graphene Oxide with Polyhedral Oligomeric Silsesquioxane (POSS) for Multifunctional Applications, *Journal of Physical Chemistry Letters* (2012), 3:1607-1612.

* cited by examiner

FIG. 1
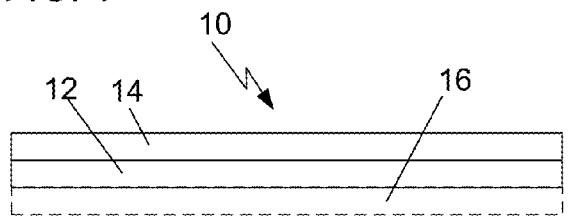
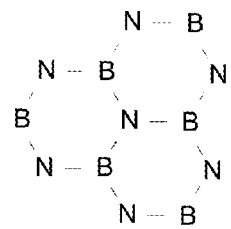
FIG. 2A
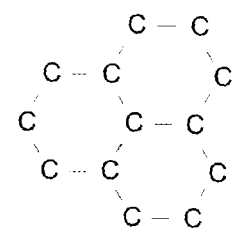
FIG. 2B
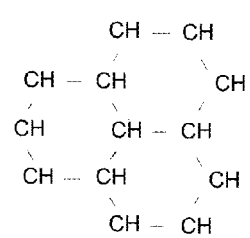
FIG. 2C
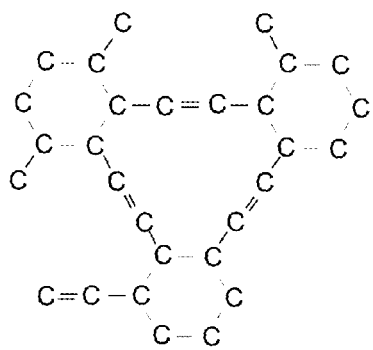
FIG. 2D
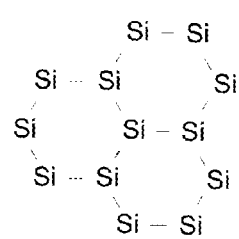
FIG. 2E
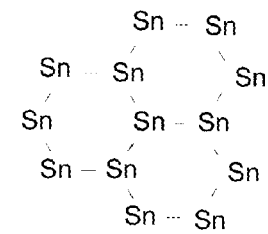
FIG. 2F

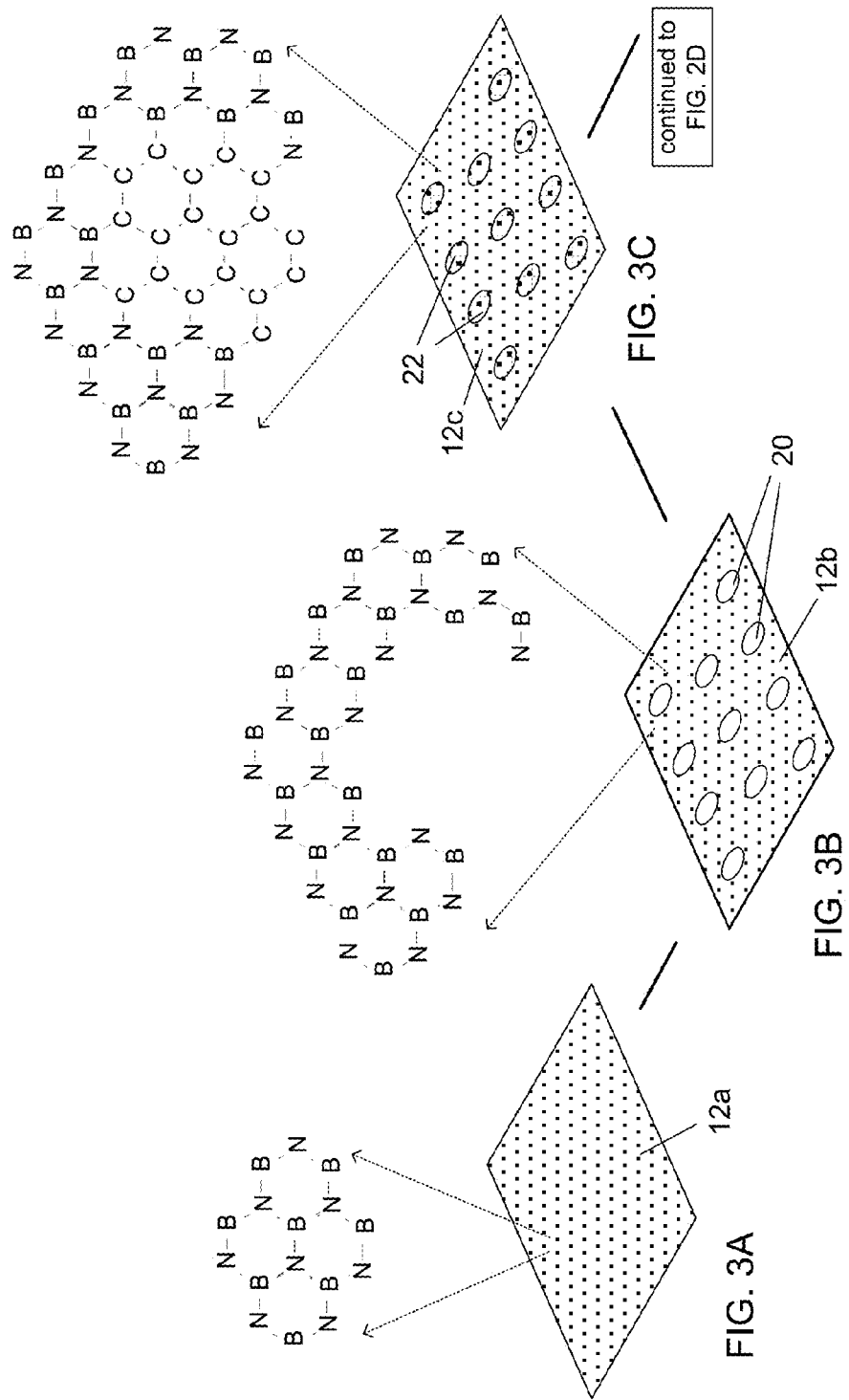

FUNCTIONALIZED BORON NITRIDE MATERIALS AND METHODS FOR THEIR PREPARATION AND USE

BACKGROUND

Modern society has an ever-growing desire for robust, lightweight and versatile portable electronic devices. One growing area of consideration for such products is the development of devices in a flexible form factor that can operate without deterioration in performance. Durability and robustness are desirable properties that contribute to the commercial success of flexible displays and photovoltaics. Beyond flexibility, printability and functionality of the components, other desirable properties for the thermally stable materials are resistance to adverse environmental conditions such as oxygen and moisture. Some of the desirable performance metrics are low permeability to water and oxygen ($10^{-6}$ g/m$^2$/day for $H_2O$ and $10^{-5}$ g/m$^2$/day for $O_2$) and high thermal stability (ideally up to 300° C.).

Substrates and barriers such as glass and metal provide excellent barriers to oxygen and moisture, but may result in rigid devices that do not satisfy applications demanding flexible devices. On the other hand, plastic substrates and transparent flexible encapsulation barriers may be used, but these often offer little protection to oxygen and water, resulting in devices that may rapidly degrade from environmental conditions.

An electrically insulating, atomically thin sheet of hexagonal boron nitride (h-BN) may provide an ideal barrier for flexible electronics, however because h-BN has a low chemical reactivity, functionalization of h-BN may be difficult. Chemical functionalization of h-BN, has resulted in breakage of the ring structures, thereby creating holes in the structure, resulting in a loss of strength and permeability. Therefore, there remains a need for flexible barrier layer materials and flexible substrate layer materials that meet the required permeability parameters for oxygen and water, while also being compatible with high-temperature processing or integrated functionality.

SUMMARY

A polymeric flexible substrate using h-BN may be provided by compatabilizing the h-BN for specific polymers without significantly compromising the gas permeability of the h-BN. The substrate may meet the desired barrier properties for oxygen and water without signifcantly sacrificing thermal stability or transparency.

In an embodiment, a sheet includes a monolayer of hexagonal boron nitride interspersed with domains of at least one functionalized material, wherein the at least one functionalized material has a hexagonal monolayer structure and is functionalized with at least one functional group.

In an embodiment, a composite film may include at least one polymer film layered with a composite sheet, wherein the composite sheet includes domains of functionalized material interspersed in a monolayer of hexagonal boron nitride. The functionalized material includes at least one functional group.

In an embodiment, an electronic device includes a printed circuit board, and the printed circuit board includes at least one substrate sheet comprising at least one polymer bonded with a composite sheet, and one or more electronic components disposed on the at least one substrate sheet. The composite sheet includes interspersed domains of hexagonal boron nitride and graphene, wherein the graphene of at least one domain of graphene includes graphene functionalized with at least one functional group configured to bond with the polymer.

In an embodiment a method for producing a functionalized hexagonal boron nitride film includes etching a monolayer of hexagonal born nitride to produce holes in the monolayer, incorporating at least one functionalizable material into the holes, and functionalizing the at least one functionalizable material with at least one functional group to produce a functionalized monolayer of hexagonal boron nitride.

BRIEF DESCRIPTION OF THE FIGURES

FIG. 1 depicts a general representation of an h-BN/polymer composite according to an embodiment.

FIGS. 2A-2F depict general representations of compounds having a generally hexagonal crystalline structure according to an embodiment.

FIGS. 3A-3E generally represent steps and components in the production of an h-BN sheet containing functionalized islands according to an embodiment.

DETAILED DESCRIPTION

Figures 3D, 3E:
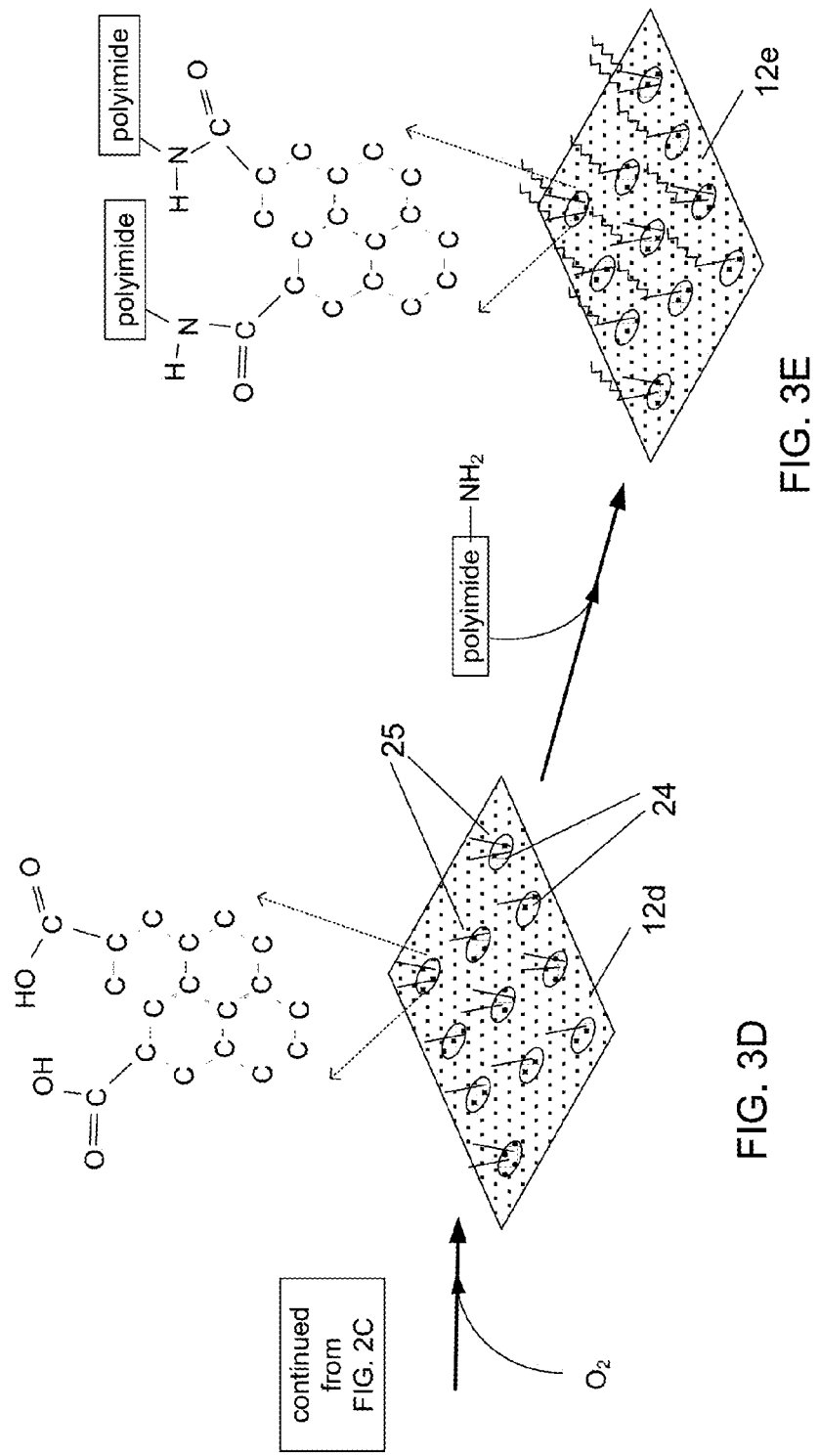

Hexagonal boron nitride (h-BN) is a heteroatom analog to atomically planar graphene, but differs from graphene in at least several respects. First, h-BN is electrically insulating with a band gap of ~5.9 eV, and h-BN has a much higher temperature stability, similar to that of a ceramic. Despite being electrically insulating, h-BN has large thermal conductivity in a direction along the 2D plane, and generally not between stacked layers. H—BN may also be mechanically very strong and, at the atomic-thin level, may be mechanically compliant. In one embodiment, monolayers of h-BN may be produced by micromechanical cleavage of bulk h-BN crystal. Monolayers of h-BN may be produced by chemical vapor deposition (CVD) processes with copper foil as a substrate.

As generally represented in FIG. 1, a flexible polymeric sheet material 10 may include a monolayer 12 of hexagonal boron nitride (h-BN) as well as at least one polymeric layer 14. The h-BN layer may include structurally incorporated domains of functionalized material. The resulting composite material 10 may provide a flexible substrate with desired barrier requirements for oxygen and water permeability without significantly sacrificing thermal stability or transparency. In an embodiment, the material sheet 10 may also include at least one additional polymeric layer 16. Hexagonal boron nitride, or h-BN, as represented in FIGS. 2A and 3A, is a heteroatom analog to the atomically 2D planar graphene structure as represented in FIG. 2B, wherein both have similar crystal structures in the form of hexagonal rings. The h-BN and graphene crystal structures differ from one another in size by only about 2%, and thus may essentially be interchangeable with one another in a planar sheet. The domains of functionalized material may include domains of graphene (FIG. 2B), or domains of other additional compounds that have a similar overall hexagonal crystal structure. Some of these additional compounds may include, but are not limited to, graphane (FIG. 2C), graphyne (FIG. 2D), silicene (FIG. 2E), stanene (FIG. 2F), and molybdenum disulfide (not shown).

In an embodiment as represented in FIG. 2A-2E, the h-BN layer 12 (shown in FIG. 1) may be a modified sheet that includes discrete islands 22 of at least one of the above-mentioned additional compounds. As represented in FIG. 2C, one of the additional compounds that may be incorporated into the modified sheet 12c may be graphene. Chemical compatibilization of the sheet 12c may be done at the material of the islands 22 as represented in FIGS. 2D and 2E. The crystal structure of the sheets therefore remains essentially intact to provide a gas/moisture barrier with thermal stability and electrical insulation. The modified h-BN sheets may have one or more of the following qualities: be optically transparent, mechanically tough, and may have a thickness equal to or less than about 10 microns, a thermal stability equal to or greater than about 300° C., a band gap of equal to or greater than about 5.9 electron volts, an oxygen permeability of equal to or less than about $10^{-5}$ $g/m^2/day$ and a water permeability of equal to or less than about $10^{-6}$ $g/m^2/day$.

The modified h-BN sheets may generally have any thickness, such as a thickness of 1 μm to 600 μm. As examples, a modified h-BN sheet may have a thickness of about 1 μm, about 5 μm, about 10 μm, about 25 μm, about 50 μm, about 75 μm, about 100 μm, about 150 μm, about 200 μm, about 250 μm, about 300 μm, about 350 μm, about 400 μm, about 450 μm, about 500 μm, about 550 μm, about 600 μm, or any value or range of values from any of the listed values to any other of the listed values (including endpoints). The modified h-BN sheets may have a thermal stability (that is, stable at a particular temperature) of at least about 250° C., or about 250° C. to about 400° C. As examples, a modified h-BN sheet may have a thermal stability of about 250° C., about 260° C., about 270° C., about 280° C., about 290° C., about 300° C., about 310° C., about 320° C., about 330° C., about 340° C., about 350° C., about 360° C., about 370° C., about 380° C., about 390° C., about 400° C., or any value or range of values from any of the listed values to any other of the listed values (including endpoints). The modified h-BN sheets may have a band gap of about 2.0 eV to about 6.0 eV. As examples, a modified h-BN sheet may have a band gap of about 2 eV, about 2.2 eV, about 2.4 eV, about 2.6 eV, about 2.8 eV, about 3.0 eV, about 3.2 eV, about 3.4 eV, about 3.6 eV, about 3.8 eV, about 4.0 eV, about 4.2 eV, about 4.4 eV, about 4.6 eV, about 4.8 eV, about 5.0 eV, about 5.2 eV, about 5.4 eV, about 5.6 eV, about 5.8 eV, about 6.0 eV, or any value or range of values from any of the listed values to any other of the listed values (including endpoints). The modified h-BN sheets may have an oxygen permeability of about 0.00001 $g/m^2/day$ to about 0.001 $g/m^2/day$. As examples, a modified h-BN sheet may have an oxygen permeability in $g/m^2/day$ of about 0.00001, about 0.00002, about 0.00003, about 0.00004, about 0.00005, about 0.00006, about 0.00007, about 0.00008, about 0.00009, about 0.0001, about 0.0002, about 0.0003, about 0.0004, about 0.0005, about 0.0006, about 0.0007, about 0.0008, about 0.0009, about 0.001 or any value or range of values from any of the listed values to any other of the listed values (including endpoints).

The modified h-BN sheets may have a water permeability of about 0.000001 $g/m^2/day$ to about 0.0001 $g/m^2/day$. As examples, a modified h-BN sheet may have a water permeability in $g/m^2/day$ of about 0.000001, about 0.000002, about 0.000003, about 0.000004, about 0.000005, about 0.000006, about 0.000007, about 0.000008, about 0.000009, about 0.00001, about 0.00002, about 0.00003, about 0.00004, about 0.00005, about 0.00006, about 0.00007, about 0.00008, about 0.00009, about 0.0001 or any value or range of values from any of the listed values to any other of the listed values (including endpoints).

Various properties of the sheet, such as, electrical conductivity, reactivity, resistivity, transparency, thermal stability, oxygen permeability, water permeability, and thermal conductivity, may be altered by varying the functionalization molecules and/or the content of other materials. In an embodiment, the size of the islands may be varied, and/or the number of islands per unit area of the sheet may be varied.

In an embodiment, the islands 22, or domains of the additional materials may be of any size that is appropriate for, or sufficient for the intended purpose of the material. In an embodiment, the islands 22 may be regular or irregular in shape, circular, oval, rectangular, or any other shape, and may be spaced from one another in a regular repeating pattern, or may be randomly dispersed on the sheet. The islands also may be parallel stripes extending across a sheet 12c at regularly, or irregularly spaced intervals, or may be intersecting arrays of parallel lines that intersect at angles of about 45° to about 90°.

A cross-sectional dimension of the islands may generally be any size, for example, a diameter of a circular island, may be at least about 100 nm, and may extend to up to at least about 10 mm. As non-limiting examples, a cross-sectional dimension may be about 100 nm, about 200 nm, about 300 nm, about 400 nm, about 500 nm, about 600 nm, about 700 nm, about 800 nm, about 900 nm, about 1 μm, about 10 μm, about 20 μm, about 30 μm, about 40 μm, about 50 μm, about 60 μm, about 70 μm, about 80 μm, about 90 μm, about 100 μm, about 200 μm, about 300 μm, about 400 μm, about 500 μm, about 600 μm, about 700 μm, about 800 μm, about 900 μm, about 1 mm, about 2 mm, about 3 mm, about 4 mm, about 5 mm, about 6 mm, about 7 mm, about 8 mm, about 9 mm, or about 10 mm, or any value or range of values from any of the listed values to any other of the listed values (including endpoints). The size and positioning of the islands 22 may vary in different portions of the sheet 12c.

The sheet 12c may be configured so that the islands 22 are about 5% to about 75% of the area of the sheet. As non-limiting examples, the total area of the islands 22 within the sheet 12c may be about 5%, about 10%, about 15%, about 20%, about 25%, about 30%, about 35%, about 40%, about 45%, about 50%, about 55%, about 60%, about 65%, about 70%, or about 75%, or any value or range of values from any of the listed values to any other of the listed values (including endpoints). Different portions of the sheet 12c may have different percentages of island areas, and some portions may not include islands.

In an embodiment as represented in FIGS. 3C-3D, the islands 22 may be functionalized with at least one functional group. For example, the islands 22 may be functionalized with a functional group that is selected or configured to bind with a particular polymer that will be used as at least one of the polymer layers 14, 16 as shown in FIG. 1. Some examples of polymers that may be used for one, or both of the polymer layers 14, 16 may include, but are not limited to, polyimide, polyaniline, polyacrylamide, polyvinylidine fluoride, poly(vinylidene fluoride-co-tri-fluoroethylene, nylon, polyvinyl chloride, polystyrene, polyethylene, polypropylene, polycarbonate, poly(diallyldimethylammonium chloride), and polycaprolactone, or any combination thereof. Some examples of flexible polyimides that may be used include, but are not limited to, flexible polyimides that have ether, isopropylidene, hexafluoroisopropylidene, methylene bridges (3,3'-dimethyl-4,4'-diaminodiphenylmethane), pyridyl with ether linkage, benzofuran, siloxane bridge, aromatic oxadiazole-diamines.

Some examples of functional groups, with which the compounds of the islands 22 may be functionalized, may include, but are not limited to, azide, amino, carboxyl, hydroxyl, carbonyl, aryl, amide, pyrene, porphyrin, thiophene, methacrylate, pyromellitic dianhydride, epoxy, nitrophenyl, polyhedral oligomeric silsesquioxane, or any combination thereof.

Figure 4A:
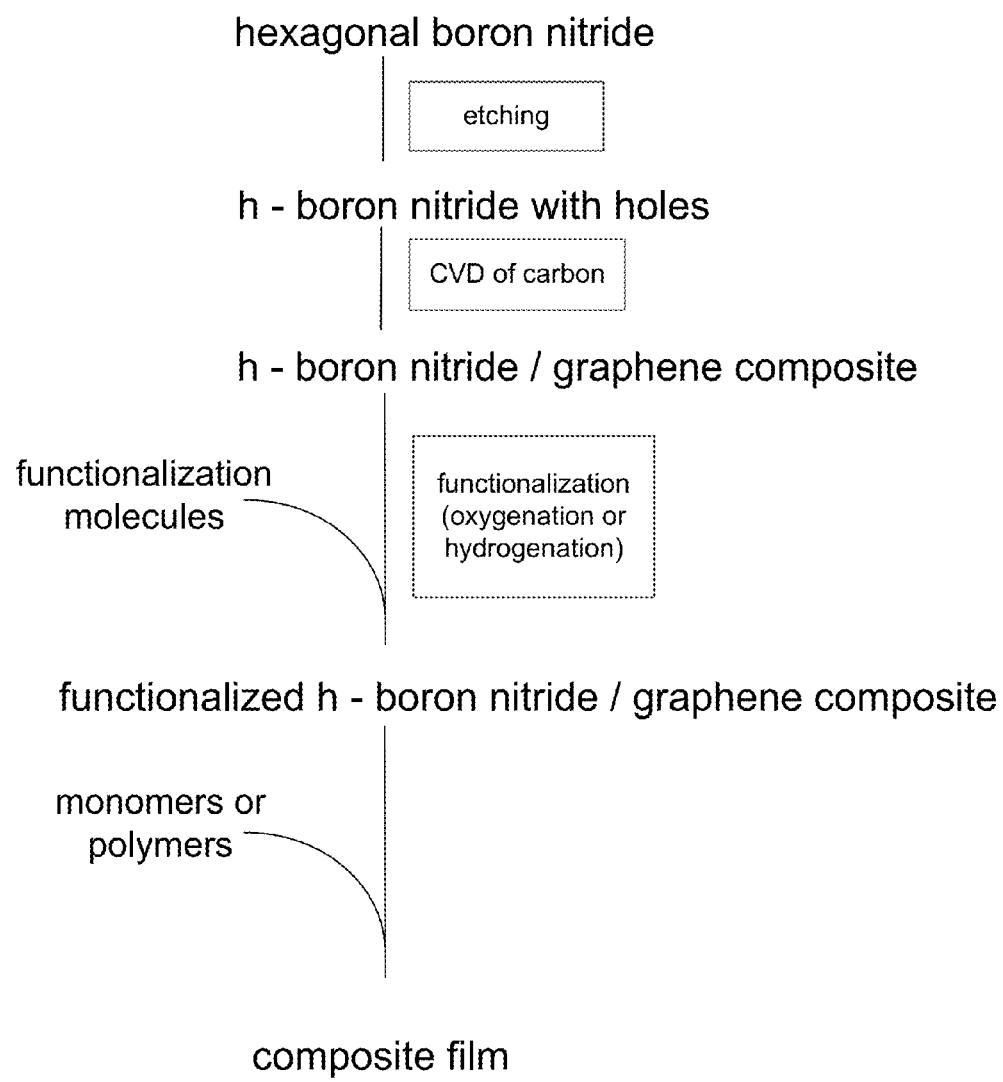
FIGS. 4A and 4B provide representative methods for the production of composite h-BN sheets according to an embodiment.

In an embodiment as represented in FIGS. 3A-3E, h-BN films containing discrete graphene islands may be produced from mono-layer sheets or films of h-BN 12a without compromising the low permeability of h-BN. As generally outlined in FIG. 4A, the h-BN films 12a may be partially etched, using photolithography for example, with focused ion beam (FIB) or Ar ions. A resultant film 12b may have a patterned area of holes 20 of a predetermined size and area density. A material, such as graphene (shown in FIG. 3C, may be deposited, or grown within the holes by using, for example, chemical vapor deposition or other crystal growth methods, to provide h-BN sheets 12c that include islands 22 of a functionalizable material.

To facilitate chemical functionalization of the domain materials, such as graphene, the material of the islands 22 may be partially oxygenated or hydrogenated, on one side of the sheet, or alternatively, on both sides of the sheet. For graphene, as represented in FIG. 3D, a partial oxidation would result in graphene oxide islands 24 that may contain from one to multiple carboxylic acid groups 25. The presence of carboxylic acid groups, for example, would provide locations for polymer bonding. In an embodiment as represented in FIG. 3E, a polyimide having terminal amine groups may be deposited on the sheet 12d to produce a composite h-BN/polymer sheet 12e.

In an alternative embodiment, the material of the islands 22 may be hydrogenated, and functionalized with an amine group. The amine groups may be reacted with pyromellitic dianhydride, a double carboxylic acid anhydride that may be used in the preparation of polyimide polymers such as a Kapton® polymer, for example.

Flexible polymeric sheet materials 10 as represented in FIG. 1, and including functionalized islands as described above, may be usable as an electrically insulating substrate for electronic components, such as a substrate for printed circuit boards. In an embodiment, an electronic device may include a printed circuit board that includes electronic components disposed on a substrate sheet 10 as represented in FIG. 1. Some examples of electronic components may include, but are not limited to a microprocessor, a diode, a microcontroller, an integrated circuit, a capacitor, a resistor, a transformer, an inductor, and a logic device, or any combination thereof.

The substrate sheet 10 may include at least one polymer layer 14 bonded with a composite h-BN layer 12. The composite h-BN layer 12 may include interspersed domains of hexagonal boron nitride and graphene, wherein the graphene of at least one of the domains of graphene may be functionalized with at least one functional group configured to bond with the polymer. The layer 12 defines a first generally planar surface and a second generally planar surface opposite the first planar surface. In an embodiment, the domains of the at least one functionalizable material are functionalized with the semiconductor material on only one of the two planar surfaces. In an alternative embodiment, the domains of the at least one functionalizable material are functionalized with the semiconductor material on both of the two planar surfaces.

In an embodiment, the composite sheet may be a monolayer sheet of hexagonal boron nitride with the domains of graphene interspersed therein, and the domains of graphene may be functionalized with at least one functional group selected from azide, aryl, pyrene, porphyrin, thiophene, methacrylate, pyromellitic dianhydride, polycaprolactone, epoxy, nitrophenyl, or polyhedral oligomeric silsesquioxane, or any combination thereof. The polymer layer may be a polymer such as nylon, polyvinyl chloride, polystyrene, polyethylene, polypropylene, polycarbonate, poly(diallyldimethylammonium chloride), or polycaprolactone, or any combination thereof.

Figure 4B:
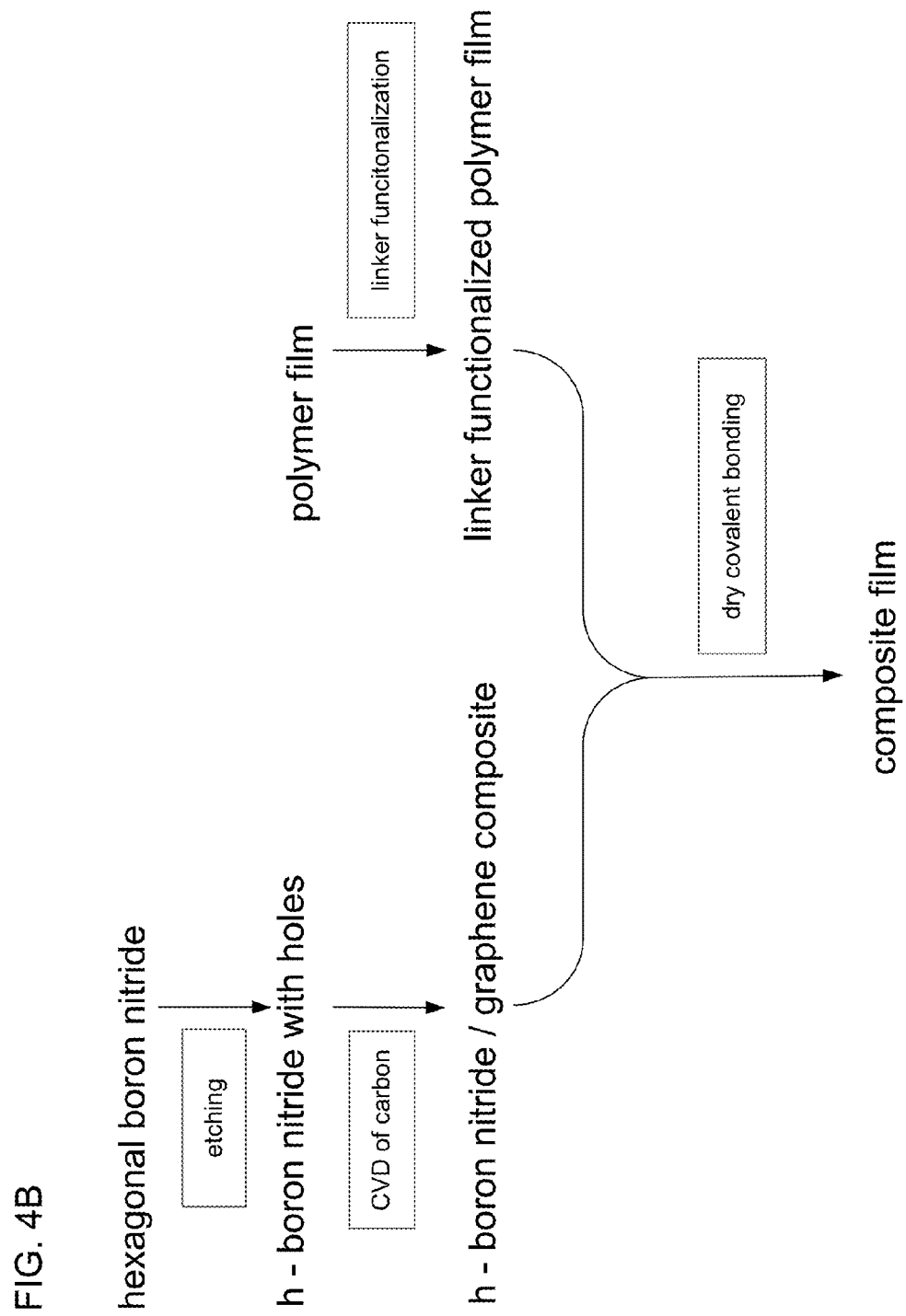

FIG. 4B represents an alternative method for producing composite films of h-BN/graphene and a polymer. The h-BN/graphene composites may be produced in a manner as described above in relation to FIG. 4A. In a separate process, a polymer film, such as, for example a polyimide film, may be functionalized to include linker groups that are configured to bind with the h-BN/graphene composites. The side of the polymer film functionalized with the linker groups may then be placed together with the h-BN/graphene composite and the layers may bond together to form a composite film.

The polymer may be functionalized with a similar pattern that essentially matches the patterns of graphene islands in the h-BN/graphene composite. A patterned masking material may be placed over the polymer and the polymer may be exposed to low-energy electron beam generated plasma to functionalize the polymer with hydroxyl, carboxyl and carbonyl groups. Linking components, such as TFPA-NH$_2$ (N-ethylamino-4-azidotetrafluorobenzoate) may be applied to the polymer by dip coating the polymer in a solution of TFPA-NH$_2$ in a solvent (such as methanol) that does not dissolve the polyimide. The TFPA-NH$_2$ attaches to the plasma-functionalized patterned polymer surface via the amine end group and acid-base interactions to carboxyl and hydroxyl groups. In an additional step, carboxyl groups present on the polymer surface may be reacted with a cross-linking agent, such as EDC/NHS (1-Ethyl-3-[3-dimethylaminopropyl] carbodiimide hydrochloride)/N-hydroxysulfosuccinimide), to couple the carboxyl groups to primary amines, to form a covalent amide bond between the TFPA and the patterned polymer surface as represented below.

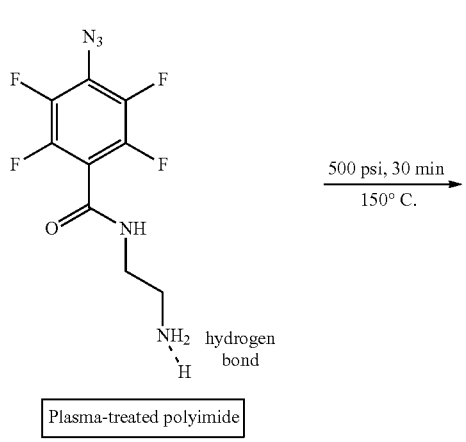

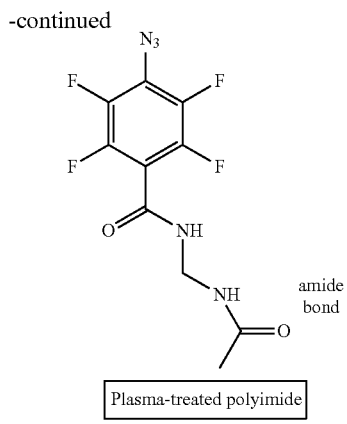

Once the functionalized h-BN/graphene sheet and polyimide films are prepared as set forth above, the polyimide film and h-BN/graphene sheet may be bonded together. In an embodiment, the two layers may be bonded via dry covalent bonding. The TFPA-patterned polymer surface may aligned on the h-BN/graphene sheet to substantially align the TFPA with the graphene. The sheets may be placed in contact with one another and may be pressed together to facilitate covalent bonding between the layers. One type of instrument that may be used for bonding the layers is an NX 2000 Nano Imprinter (Nanonex Corp., Monmouth Junction, N.J., USA). A covalent bonding, as represented below may take place when the layers are subjected to a pressure of about 500 psi (about 3.45 megapascals) for about 30 minutes at a temperature of about 150° C., wherein the azide terminal group of the TFPA-NH$_2$ molecules, which were inactive during linker molecule deposition, are heat activated to form a covalent carbene bond between the graphene and polyimide via the TFPA linker.

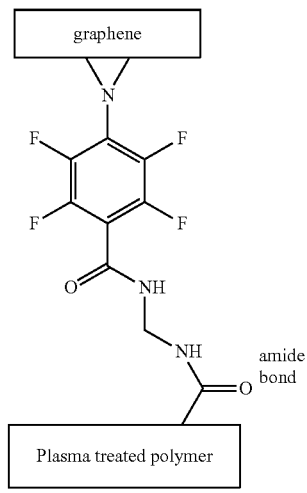 [SMILES: CC(=O)NCNC(=O)c1c(F)c(F)c(N(C)C)c(F)c1F]

In an alternative embodiment, h-BN sheets that include islands or domains of functionalizable material may be configured as at least one component layer of touch sensor panels or sheets, wherein the islands 22 may be functionalized with conductor or semiconductor material. In general, there are at least three types of touch sensor configurations: variable resistor, piezoelectric, or capacitive type.

Figure 5:
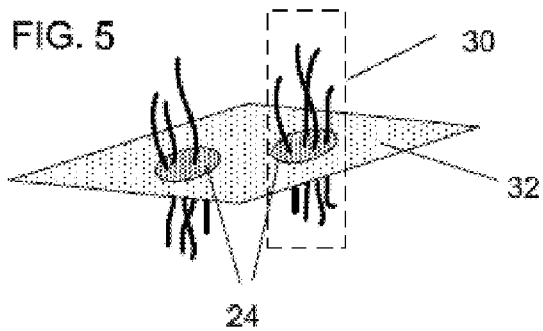
FIG. 5 depicts an enlarged view of functionalized islands in an h-BN sheet according to an embodiment.

As represented in FIG. 5A, the functionalized islands 24 may generally represent pillars 30 extending from an insulating h-BN sheet 32. A sheet 32 may be functionalized on either one side or both sides. The pillars 30 may be slightly conductive and may function as variable resistors. Some examples of semiconductor materials may include, but are not limited to, semiconductor nanowires, inorganic semiconductor microwires, silicon microwires, and conductive polydimethylsiloxane.

Figure 6:
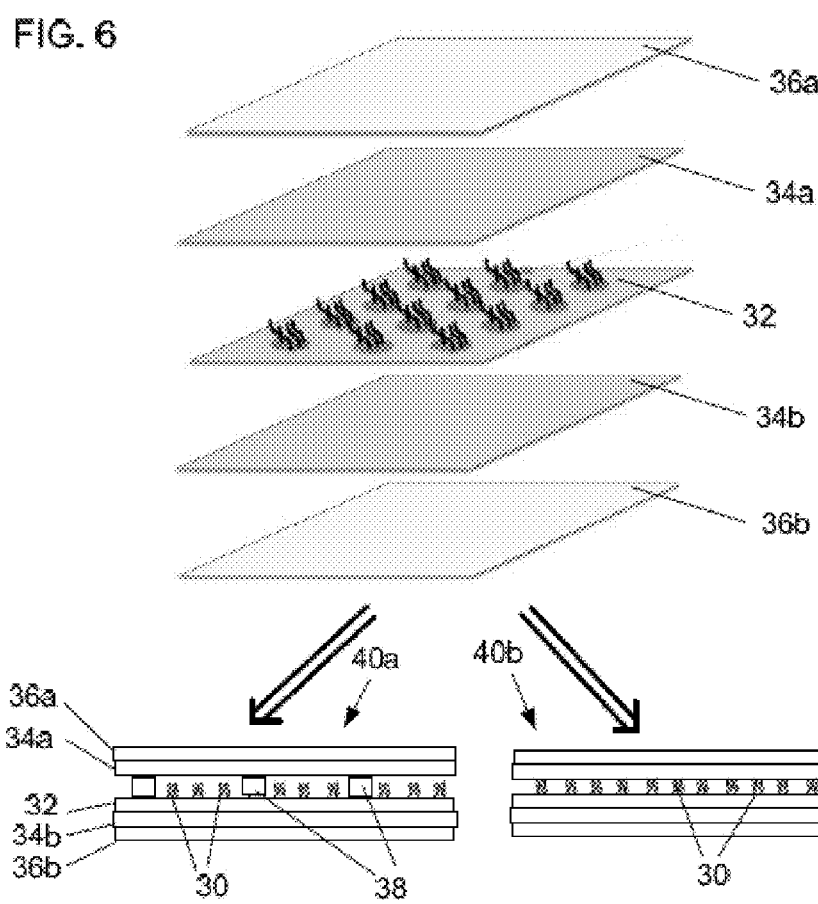
FIG. 6 provides a representation of component layers in a touch sensor sheet according to embodiments.

An h-BN/graphene sheet 32 functionalized with semiconductor material may be used, for example, as a component of a tactile sensor, that may be used in a touch panel. As shown in FIG. 6, the functionalized sheet 32 may be disposed in conjunction with flexible electrode sheets 34a, 34b, and external cover sheets 36a, 36b of a polymer. Electrode sheets 34a, 34b, may be poly(3,4-ethylenedioxythiophene) polystyrene sulfonate (PEDOT:PSS), or indium tin oxide (ITO), or silver/gold depositions. Sheets 36a, 36b may be of a polymer selected from the list provided above. As more specific examples, however, for a variable-resistor touch sensor (polymer based), the polymer may be PANI (polyaniline) doped with HCSA (camphorsulfonic acid); for a piezoelectric touch sensor, the polymer may be PVDF-TrFE (poly(vinylidene fluoride-co-tri-fluoroethylene); and for a capacitive-touch sensor, the polymer may be a polyimide.

Figure 7:
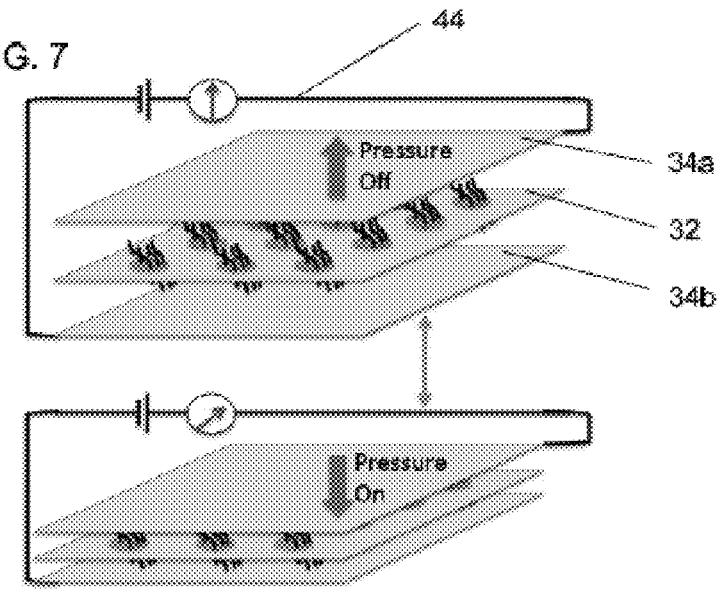
FIG. 7 depicts operation of a touch sensor circuit according to an embodiment.

In an embodiment as represented by composite 40a in FIG. 6, an h-BN layer in a touch sensor arrangement may have semiconductor columns 30 extending from one side (or alternatively, both sides) of the sheet. The opposite side of the sheet 32 may be in direct contact with the electrode sheet 34b. The second electrode sheet 34a may be spaced from the semiconductor column 30 by spacer elements, such as polymer ridges 38. Upon compression of the composite 40a to force electrode sheets 34a, 34b towards one another, as represented in FIG. 7, electrode sheet 34a may be moved into contact with the semiconductor columns to close a circuit 44 and provide an electrical signal representative of a point of touch contact on the sheet.

Figure 8:
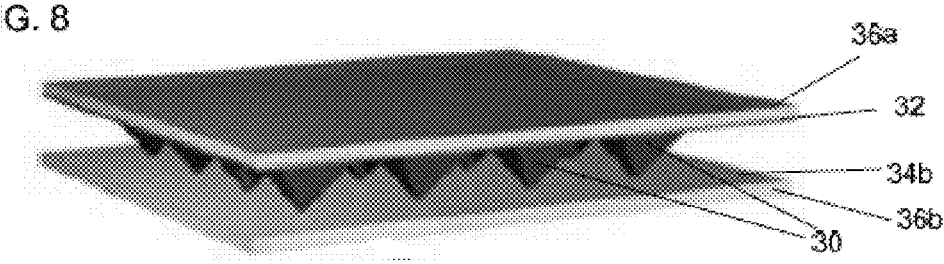
FIG. 8 provides an alternative configuration of a touch sensor according to an embodiment.
Figure 8:
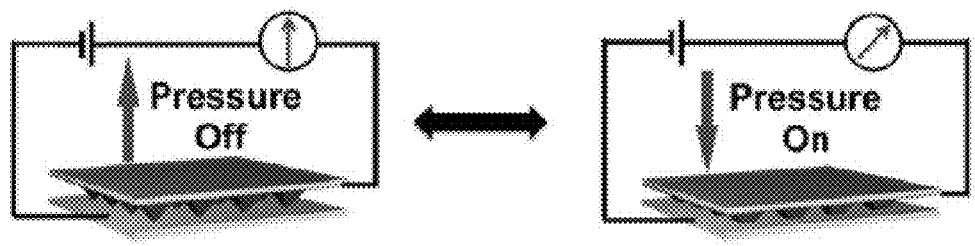

Alternatively, for a capacitive sensor arrangement, as represented by composite 40b, the electrode sheet 34a may be layered in contact with the semiconductor columns 30. The semiconductor columns 30 may be configured as dielectric materials so that the pressure applied may directly correlate with conductance wherein a greater pressure may provide a greater current flow. In an embodiment, the pillars 30 may be single crystal silicon pillars that are able to exhibit a reversible tactile response. Alternatively, as represented in FIG. 8, the pillars 30a may have a pyramidal configuration extending away from the sheet 32, wherein compression of the sheets results in increased surface contact with the pyramids due to deformation of the pyramid structures. In an embodiment, the pyramid structures may be conductive polymers, such as, for example, graphene oxide/polydimethylsiloxanes (PDMS).

A touch sensor may include a sheet having a monolayer of hexagonal born nitride interspersed with domains of at least one functionalized material, wherein the at least one functionalized material has a hexagonal monolayer structure and is functionalized with at least one functional group. The at least one functional group may include at least one semiconductor material selected from inorganic semiconductor nanowires, inorganic semiconductor microwires, silicon microwires, and conductive polydimethylsiloxane. The sheet defines a first generally planar surface and a second generally planar surface opposite the first planar surface, and, in an embodiment, the domains of the at least one functionalized material are functionalized with the semiconductor material on the first planar surface.

The sheet may include a first electrode film disposed adjacent the first planar surface wherein the first electrode film is configured to move towards the first planar surface to contact the semiconductor material and to move away from the first planar surface out of contact with the semiconductor material, and the sheet may include a second electrode film disposed adjacent to the second planar surface, wherein the second electrode film is configured to be in contact with the domains of the at least one functionalized material. With such a configuration, when the first electrode film is in contact with the semiconductor material on the first planar surface and the second electrode film is in contact with the domains of the at least one functionalized material on the second surface, a conductive path from the first electrode film to the second electrode film may be formed. The sheet may thereby provide a touch sensor wherein a pressure applied to at least one of the planar surfaces to force the electrode films towards one another and into contact via the functionalized material may provide an electric signal corresponding to the location of contact.

In an alternative embodiment, the first electrode film may be spaced at a first distance from the first planar surface. The first electrode film and first planar surface may be configured to be movable towards one another under a pressure applied to at least one of the first electrode film and the second electrode film in a direction towards the other of the first electrode film and the second electrode film. To provide for variable current flow, the semiconductor material may be configured to provide an increased current flow between the first electrode film and the second electrode film as the first distance is reduced, as well as an increased resistance to the applied pressure as the first distance is reduced. In such an embodiment, the at least one functionalized material may be functionalized graphene, and the semiconductor material may be reduced graphene oxide/polydimethylsiloxane in the shape of pyramidal structures with a base disposed on the graphene and an apex disposed towards the first electrode film.

In an alternative embodiment, the domains of the at least one functionalized material may be functionalized with the semiconductor material on both the first planar surface and the second planar surface. The sheet may include a first electrode film disposed adjacent the first planar surface and movable towards and away from the first planar surface into and out of contact with the semiconductor material of the first planar surface, and a second electrode film disposed adjacent the second planar surface and movable towards and away from the second planar surface into and out of contact with the semiconductor material of the second planar surface. With such a configuration, a closed conductive path from the first electrode film to the second electrode film may be provided when the first electrode film is in contact with the semiconductor material on the first surface and the second electrode film is in contact with the semiconductor material on the second surface.

EXAMPLES

Example 1: Functionalized h-BN Sheets

A monolayer of h-BN is produced by chemical vapor deposition of boron and nitrogen on a copper foil. The resultant h-BN is overlaid with a patterned lithograph representing the desired holes that will be produced in the film. The holes may have a diameter of about 1 micron and are evenly spaced on the film to encompass about 10% of the area of the film. The film is etched by passing an ion beam over the film to produce holes in the film at the designated locations.

The holes in the h-BN are filled in by growing graphene within the holes by chemical vapor deposition of carbon in the holes. Since graphene has essentially the same crystal structure as the h-BN, the graphene essentially fills in the holes of the h-BN to produce an intact sheet of h-BN/graphene wherein about 10% of the area of the sheet is graphene islands interspersed across the sheet.

Example 2: h-BN Substrate Sheets

A h-BN/graphene sheet from Example 1 is coated with polymer layers to protect and stabilize the h-BN layer. The h-BN/graphene sheet is first functionalized by oxygenation of the graphene to provide functional sites for bonding with the polymer. Both sides of the sheet are functionalized. The h-BN/graphene sheet is exposed to oxygen, under conditions sufficient for oxidation to occur, to form graphene oxide islands, wherein multiple carboxylic acid groups will be present on each island. The carboxylic acid groups provide binding sites for polyimide polymers. Kapton® polyimide, or poly-oxydiphenylene-pyromellitimide, is deposited on both sides of the h-BN/graphene sheet to produce a flexible composite h-BN substrate having oxygen permeability of less than about $10^{-5}$ g/m$^2$/day and water permeability of less than about $10^{-6}$ g/m$^2$/day.

Example 3: Printed Circuit Boards

A substrate sheet of Example 2 is imprinted with electrically conductive traces. Various electronic components, such as microprocessors, diodes, microcontrollers, integrated circuits, capacitors, resistors, transformers, inductors, and logic devices, for example, are installed on the imprinted sheet. With the flexible h-BN/graphene substrate, the circuit board is flexible for use in flexible electronic devices, such as flexible displays.

Example 4: Touch Panel

A flexible touch panel is produced based on the h-BN/graphene sheet of Example 1. Both sides of the h-BN/graphene sheet are functionalized with silicon-based nanowires to produce conductive columns that extend through the insulative h-BN sheet. A spacer grid is deposited on each side of the sheet, followed by electrode sheets of poly(3,4-ethylenedioxythiophene) polystyrene sulfonate, that are spaced away from the silicon-based nanowires by the distance of the spacer elements. The electrode sheets are connected with electronic circuitry configured to provide an electrical signal upon passage of an electric current through the h-BN sheet during contact of the electrode sheets with a conductive column.

Example 5: Tactile Sensor

A tactile sensor is produced from modified h-BN sheets with polymeric linkers. An h-BN sheet is produced by chemical vapor deposition of boron and nitrogen in the form of ammonia borane ($NH_3$—$BH_3$) onto a Cu/Ni foil substrate. The h-BN sheet is etched with a micropattern. A laser-cut masking material having a patterned array of 10 µm openings is placed over the h-BN sheet, and the sheet is exposed to argon ions to etch 10 µm holes into the sheet.

The etched sheet is placed in a chemical vapor deposition furnace to grow graphene in the holes. The temperature within the furnace is raised to about 950° C. and a gas flow of about 10 torr Ar/$H_2$ is introduced to flush the chamber. The Ar/$H_2$ gas is cut off when the temperature reaches about 950° C. Methane is introduced into the chamber at a flow rate of 4 sccm (standard cubic centimeter per minute) for about 10 minutes for growth of the graphene in the holes of the h-BN. Upon completion, a fast annealing is done at a rate of about 50° C./minute under the protection of a 500 mtorr Ar/$H_2$ atmosphere to produce an h-BN/graphene sheet on the foil substrate.

In a further process, a polyimide film is functionalized. A patterned mask is placed over the polymer film and the film will be exposed to low-energy electron beam generated plasma to functionalize the terminal surface of the polymer with hydroxyl, carboxyl and carbonyl groups, without etching. A one-minute exposure to carbon dioxide plasma will be sufficient to introduce the hydroxyl, carboxyl, and carbonyl functional groups.

The functionalized surface of the polyimide is further functionalized with an azide linking component in a two-step process. In a first step, a TFPA-$NH_2$ (N-ethylamino-4-azidotetrafluorobenzoate) linker is applied to the polymer by dip coating the polymer in a solution of TFPA-$NH_2$ in methanol. In an additional step, carboxyl groups present on the polymer surface are reacted with the cross-linking agent EDC/NHS (1-Ethyl-3-[3-dimethylaminopropyl]carbodiimide hydrochloride)/N-hydroxysulfosuccinimide) to form a covalent amide bond between the TFPA and the patterned polymer surface.

Once the functionalized h-BN/graphene sheet and polyimide films are prepared as set forth above, the polyimide film and h-BN/graphene sheet are bonded together via dry covalent bonding. The TFPA-patterned polymer surface is aligned on the h-BN/graphene sheet to substantially align the TFPA with the graphene. The sheets are placed in contact with one another and are pressed together with an NX 2000 Nano Imprinter (Nanonex Corp., Monmouth Junction, N.J., USA) at a pressure of about 500 psi (about 3.45 megapascals) for about 30 minutes at a temperature of about 150° C., wherein the azide terminal group of the TFPA-$NH_2$ molecules, are heat activated to form a covalent carbene bond between the graphene and polyimide via the TFPA linker.

A copper foil (or PEDOT based plastic electrodes) is placed on top of the imide film side of the composite. The composite is inverted and the foil substrate is removed from the h-BN/graphene side of the composite to expose the other surface of the h-BN graphene sheet. This second side of the graphene sheet is bonded with a functionalized polyimide in the same manner as was used for the first side, and an additional copper foil (or PEDOT based plastic electrodes) is placed on the second polyimide sheet.

In general, the polymer-h-BN/graphene transfer time including plasma treatment, dip coating, and azide functionalization may be less than four hours. It should be noted that essentially all of steps in this method (h-BN/graphene synthesis on Cu foil, plasma treatment of plastics, and the following dip coating step) may be scalable, and so there may be no limitation to the size of h-BN/graphene films that can be transferred.

Example 6: Variable Resistance Tactile Sensor with Silicon Micropillars

As represented in FIGS. 9A-9I, a tactile sensor is produced from modified h-BN sheets and silicon micropillars. An h-BN sheet (52 shown in FIG. 9C) is produced by chemical vapor deposition of boron and nitrogen in the form of ammonia borane ($NH_3$—$BH_3$) onto a Cu/Ni foil substrate 50. The h-BN sheet 52 is etched with a micropattern. A laser-cut masking material having a patterned array of 10 μm openings is placed over the h-BN sheet 52, and the sheet is exposed to argon ions to etch 10 μm holes into the sheet.

The etched sheet 52 is placed in a chemical vapor deposition furnace to grow graphene in the holes. The temperature within the furnace is raised to about 950° C. and a gas flow of about 10 torr Ar/$H_2$ is introduced to flush the chamber. The Ar/$H_2$ gas is cut off when the temperature reaches about 950° C. Methane is introduced into the chamber at a flow rate of 4 sccm (standard cubic centimeter per minute) for about 10 minutes for growth of the graphene 54 in the holes of the h-BN sheet 52. Upon completion, a fast annealing is done at a rate of about 50° C./minute under the protection of a 500 mtorr Ar/$H_2$ atmosphere to produce an h-BN/graphene sheet 52, 54 on the foil substrate 50 as shown in FIG. 9C.

In a further process, silicon micropillars 62 are grown/deposited on a silicon substrate 60 in a pattern configured to essentially match the pattern of the graphene 54 in the h-BN-graphene sheet 52. A silicon sheet 60 is covered with a mask of sputtered aluminum oxide, wherein the mask has holes essentially corresponding to the pattern of the holes that were made in the h-BN sheet 52. Deep reactive ion etching (DREI) is done on the exposed silicon sections, attacking the silicon to form pillars 62, while simultaneously depositing a chemically inert passivation layer on the pillar sidewalls using $SF_6$/$C_4F_8$ gas mixture (Bosch process) to produce a silicon sheet as represented in FIG. 9A.

After the pillars 62 are formed, the tops of the pillars are treated with Piranha solution (7:3 v/v conc. $H_2SO_4$, 35 wt % $H_2O_2$) followed by a thorough washing with boiling water. The silicon pillars 62 are treated with a solution of PFPA-silane 64 in toluene (12.6 mM) for 4 hours, washed with toluene, and cured at room temperature overnight to provide a silicon sheet of PFPA functionalized pillars as represented in FIG. 9B. The silicon sheet with the PFPA-functionalized pillars is inverted and placed on the h-BN-graphene, aligning the pillars 62 with the graphene 54 as represented in FIG. 9C. The pillars 62 are pressed together with the graphene 54 by applying a pressure of about 10 psi (about 68.9 kilopascals) to the stacked sheets. The assembly is heated to about 140° C. and is heated at about 140° C. for about 40 minutes to form internal linkages to bond the h-BN/graphene 52, 54 with the pillars 62 and form a composite as represented in FIG. 9D. Alternatively, the internal linkages may be triggered photochemically by UV radiation. The silicon substrate 60 is removed from the silicon pillars 62 as represented in FIG. 9E, and a flexible, insulating polymeric encapsulant 66 is added to surround the pillars 62 to form a composite as represented in FIG. 9F. Alternatively, the flexible polymeric encapsulant 66 may be added prior to removal of the silicon substrate 60.

Figures 9A, 9B, 9C, 9D, 9E, 9F, 9G, 9H, 9I:
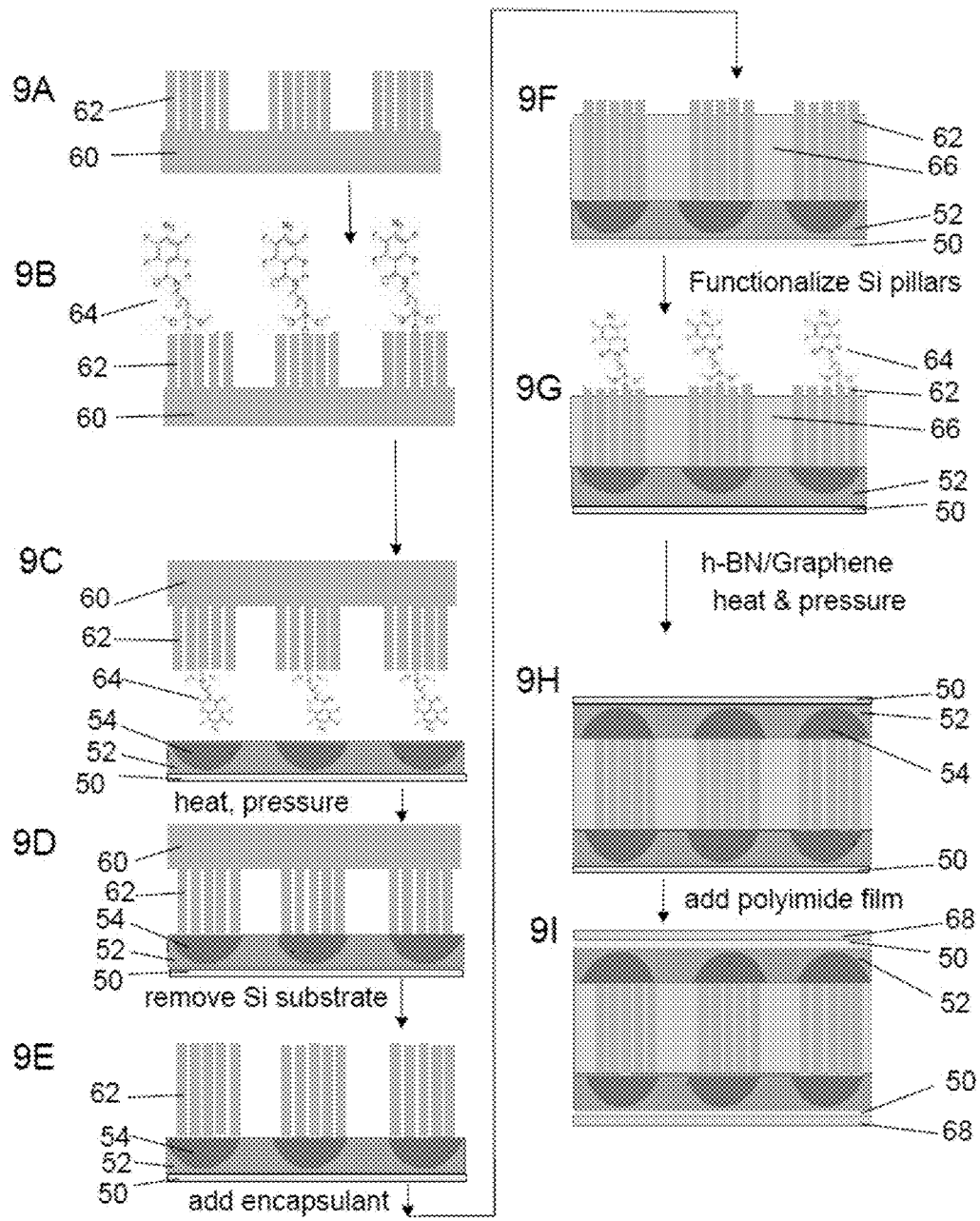
FIGS. 9A-9I represent steps in a method for producing a variable resistance tactile sensor according to an embodiment.

The ends of the pillars 62 that become exposed upon removal of the silicon substrate 60 are functionalized as represented in FIG. 9G. The exposed ends are treated with Piranha solution, and this will be followed by a thorough washing with boiling water. The ends will be treated with silage-functionalized PFPA 64. As represented in FIG. 9H, a second h-BN-graphene sheet 50a, 52a, 54a is placed over the treated ends and aligned so that the pillars 62 correspond essentially with the graphene 52a, and the graphene is attached with the pillars ends by activation of the PFPA moiety using heat and pressure of about 10 psi (about 68.9 kilopascals), about 140° C., for about 40 minutes. Each of the top and bottom surfaces of the composite, as represented in FIG. 9H, is the metal foil substrates 50 of the h-BN/graphene composite. In an additional step, a polyimide sheet 68 is placed over the metal substrates 50 to provide a sensor configuration as represented in FIG. 9I.

Example 7: Variable Resistance Tactile Sensor from Porous Polymer

Figure 10:
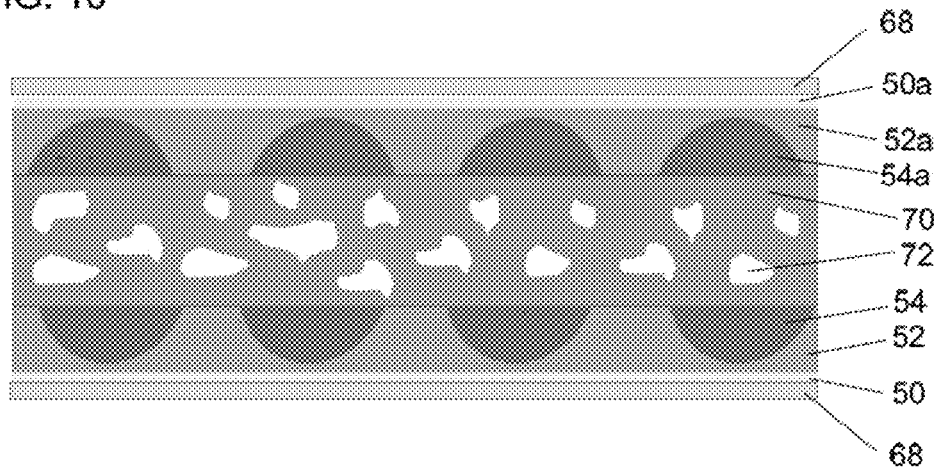
FIG. 10 depicts a configuration of a variable resistance touch sensor according to an embodiment.

A porous variable resistance sensor as represented in FIG. 10 is made by in situ photopolymerization of a UV-curable glue 70 (a powder of PS (polystyrene) and PANI (polyaniline) doped with HCSA (camphorsulfonic acid)). The PANI:HCSA is synthesized by oxidative chemical polymerization of aniline in 1.0M HCSA aqueous solution using ammonium peroxydisulfate as an oxidizing agent. The PS and PANI:HSCA are blended at a blending ratio of 1:1. After blending, the glue mixture 70 is a viscous paste and will be spread on an h-BN/graphene sheet 50, 52, 54. A second h-BN/graphene sheet 50a, 52a, 54a is inverted over the paste 70 to provide a paste layer between two h-BN/graphene sheets. The assembly is exposed to UV light to polymerize and bond the PANI:HCSA-PS blend to the h-BN-graphene sheets to form a composite. The polymerized paste 70 is porous and contain air channels 74 that make the composite compressible to alter the resistance to current flow through the sensor. The surfaces of the composite are covered with a polymer layer 68 such as polyimide.

The examples demonstrate that flexible composite sheets having improved oxygen and moisture impermeability and improved thermal stability may be produced from h-BN sheets. Such sheets may be useful for the production of flexible electronic devices that can operate without deterioration in performance due to environmental conditions.

This disclosure is not limited to the particular systems, devices and methods described, as these may vary. The terminology used in the description is for the purpose of describing the particular versions or embodiments only, and is not intended to limit the scope.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A sheet comprising a monolayer of hexagonal boron nitride interspersed with domains of at least one functionalized material, wherein the at least one functionalized material has a hexagonal monolayer structure; and the sheet has a first planar surface and a second planar surface opposite to the first planar surface, and the domains of the at least one functionalized material are functionalized with a semiconductor material on the first planar surface; the sheet further comprises:
   a first electrode film disposed adjacent to the first planar surface of the sheet, wherein the first electrode film is configured to contact the semiconductor material; and
   a second electrode film disposed adjacent to the second planar surface of the sheet, wherein the second electrode film is configured to contact the domains of the at least one functionalized material;
   the first electrode film in contact with the semiconductor material and the second electrode film in contact with the domains of the at least one functionalized material define a conductive path from the first electrode film to the second electrode film.

2. The sheet of claim 1, wherein the at least one functionalized material comprises at least one of graphane, graphene, graphyne, silicene, stanene, and molybdenum disulfide.

3. The sheet of claim 1, wherein the domains of the at least one functionalized material have a dimension of at least about 100 nm.

4. The sheet of claim 1, wherein the domains of the at least one functionalized material comprise about 5% to about 75% of the area of the sheet.

5. The sheet of claim 1, wherein the at least one functionalized material comprises functionalized graphene.

6. The sheet of claim 1, further comprising at least one polymer layer.

7. The sheet of claim 6, wherein the at least one polymer layer comprises polymer selected from at least one of polyimide, polyaniline, polyacrylamide, polyvinylidine fluoride, nylon, polyvinyl chloride, polystyrene, polyethylene, polypropylene, polycarbonate, poly(vinylidene fluoride-co-tri-fluoroethylene), poly(diallyldimethylammonium chloride), polycaprolactone, or any combination thereof.

8. The sheet of claim 1, wherein the sheet is thermally stable at a temperature of greater than about 300° C. and has a band gap of at least about 5.9 electron volts.

9. The sheet of claim 1, wherein the sheet has an oxygen permeability equal to or less than about $10^{-5}$ g/m$^2$/day and has a water permeability equal to or less than about $10^{-6}$ g/m$^2$/day.

10. The sheet of claim 1, wherein the at least one functionalized material is functionalized with the semiconductor material selected from the group consisting of inorganic semiconductor nanowires, inorganic semiconductor microwires, silicon microwires, and conductive polydimethylsiloxane.

11. The sheet of claim 1, wherein the sheet is a component of a touch sensor.

12. The sheet of claim 1, wherein the domains of the at least one functionalized material are additionally functionalized with the semiconductor material on the second planar surface.

13. A flexible substrate for electronic devices, the flexible substrate comprising:
   a composite sheet, wherein the composite sheet comprises domains of at least one functionalized material interspersed in a monolayer of hexagonal boron nitride, wherein the domains of the at least one functionalized material are functionalized with a semiconductor material selected from inorganic semiconductor nanowires or inorganic semiconductor microwires; and
   at least one polymer film.

14. The flexible substrate of claim 13, wherein the at least one functionalized material comprises at least one of graphene, silicene, stanene, and molybdenum disulfide.

15. The flexible substrate of claim 13, wherein the polymer film comprises a polymer selected from the group consisting of polyimide, polyaniline, polyacrylamide, polyvinylidine fluoride, nylon, polyvinyl chloride, polystyrene, polyethylene, polypropylene, polycarbonate, poly(vinylidene fluoride-co-tri-fluoroethylene), poly(diallyldimethyl ammonium chloride), polycaprolactone, or any combination thereof.

16. The flexible substrate of claim 13, wherein the flexible substrate has an oxygen permeability of equal to or less than about $10^{-5}$ g/m$^2$/day and a water permeability equal to or less than about $10^{-6}$ g/m$^2$/day.

17. The flexible substrate of claim 13, wherein:
the at least one functionalized material comprises functionalized graphene.

18. The flexible substrate of claim 13, wherein:
the composite sheet has a first planar surface and a second planar surface opposite to the first planar surface;
the domains of the at least one functionalized material are functionalized with the the semiconductor material on the first planar surface;
the flexible substrate further comprises:
- a first electrode film disposed between the at least one polymer film and the first planar surface, wherein the first electrode film is configured to contact the semiconductor material; and
- a second electrode film disposed on the second planar surface, wherein the second electrode film is configured to contact the domains of the at least one functionalized material;
- the first electrode film in contact with the semiconductor material on the first planar surface and the second electrode film in contact with the domains of the at least one functionalized material define a conductive path from the first electrode film to the second electrode film.

19. The flexible substrate of claim 13, wherein:
the composite sheet has a first planar surface and a second planar surface opposite to the first planar surface;
the domains of the at least one functionalized material are functionalized with the semiconductor material on each of the first planar surface and the second planar surface;
the composite sheet further comprises:
- a first electrode film disposed between the at least one polymer film and the first planar surface;
- a second electrode film disposed adjacent to the second planar surface; and
- an additional polymer film disposed on the second electrode film.

* * * * *

UNITED STATES PATENT AND TRADEMARK OFFICE
CERTIFICATE OF CORRECTION

| | | |
|---|---|---|
| PATENT NO. | : 9,859,034 B2 | Page 1 of 2 |
| APPLICATION NO. | : 14/665472 | |
| DATED | : January 2, 2018 | |
| INVENTOR(S) | : Sjong | |

It is certified that error appears in the above-identified patent and that said Letters Patent is hereby corrected as shown below:

On the Title Page

In Item (57), under "ABSTRACT", in Column 2, Line 2, delete "born nitride" and insert -- boron nitride --, therefor.

In the Specification

In Column 1, Line 31, delete "however because" and insert -- however, because --, therefor.

In Column 1, Line 45, delete "compatabilizing" and insert -- compatibilizing --, therefor.

In Column 1, Line 48, delete "signifcantly" and insert -- significantly --, therefor.

In Column 2, Line 6, delete "born nitride" and insert -- boron nitride --, therefor.

In Column 2, Line 30, delete "depicts operation" and insert -- depicts an operation --, therefor.

In Column 3, Line 13, delete "FIG. 2A-2E," and insert -- FIGS. 2A-2E, --, therefor.

In Column 3, Line 21, delete "sheets therefore remains" and insert -- sheets, therefore, remains --, therefor.

In Column 4, Line 32, delete "extend to up to" and insert -- extend up to --, therefor.

In Column 4, Line 65, delete "poly(vinylidene" and insert -- polyvinylidene --, therefor.

In Column 5, Line 23, delete "(shown in FIG. 3C," and insert -- (shown in FIG. 3C), --, therefor.

In Column 5, Line 64, delete "layer 12 defines" and insert -- h-BN layer 12 defines --, therefor.

Signed and Sealed this
Sixth Day of November, 2018

Andrei Iancu
*Director of the United States Patent and Trademark Office*

CERTIFICATE OF CORRECTION (continued)
U.S. Pat. No. 9,859,034 B2

In Column 6, Line 22, delete "example a polyimide" and insert -- example, a polyimide --, therefor.

In Column 6, Lines 45-46, delete "hydrochloride)/N-hydroxysulfosuccinimide)," and insert -- hydrochloride)/N-hydroxysulfosuccinimide, --, therefor.

In Column 7, Line 22, delete "may aligned" and insert -- may be aligned --, therefor.

In Column 8, Line 22, delete "(poly(vinylidene" and insert -- (polyvinylidene --, therefor.

In Column 8, Line 55, delete "born nitride" and insert -- boron nitride --, therefor.

In Column 11, Line 29, delete "hydrochloride)/N-hydroxysulfosuccinimide)" and insert -- hydrochloride)/N-hydroxysulfosuccinimide --, therefor.

In Column 12, Line 24, delete "silicon sheet 60 is" and insert -- silicon sheet is --, therefor.

In Column 14, Line 39, delete "recitation no" and insert -- recitation, no --, therefor.

In Column 14, Line 61, delete "general such" and insert -- general, such --, therefor.

In Column 15, Line 1, delete "general such" and insert -- general, such --, therefor.

In the Claims

In Column 17, Line 8, in Claim 18, delete "with the the" and insert -- with the --, therefor.